United States Patent [19]

Aigo

[11] Patent Number: 5,190,064
[45] Date of Patent: Mar. 2, 1993

[54] APPARATUS FOR WASHING SEMICONDUCTOR MATERIALS

[76] Inventor: Seiichiro Aigo, 3-15-13, Negishi, Daito-ku, Tokyo, Japan

[21] Appl. No.: 690,309

[22] Filed: Apr. 24, 1991

[30] Foreign Application Priority Data

Apr. 30, 1990 [JP] Japan .................. 2-112629

[51] Int. Cl.$^5$ .................. B08B 3/04
[52] U.S. Cl. .................. 134/84; 134/94.1; 134/102.1; 134/201; 134/902
[58] Field of Search .................. 134/155, 186, 902, 102, 134/84, 95, 201, 108, 94.1, 102.1; 361/213, 215

[56] References Cited

U.S. PATENT DOCUMENTS

| | | | |
|---|---|---|---|
| 4,132,567 | 1/1979 | Blackwood | 134/102 |
| 4,429,983 | 2/1984 | Cortellino et al. | 134/902 |
| 4,520,834 | 6/1985 | DiCicco | 134/902 X |
| 4,777,970 | 10/1988 | Kusuhara | 134/902 |
| 4,827,954 | 5/1989 | Layton | 134/902 X |
| 4,838,979 | 6/1989 | Nishida et al. | 134/902 X |

FOREIGN PATENT DOCUMENTS

| | | | |
|---|---|---|---|
| 707994 | 1/1980 | Japan | 134/108 |
| 63-3101121 | 12/1988 | Japan | 134/902 |
| 565727 | 7/1977 | U.S.S.R. | 134/108 |

Primary Examiner—Frankie L. Stinson
Attorney, Agent, or Firm—Wegner, Cantor, Mueller & Player

[57] ABSTRACT

An apparatus for semiconductor wafers is disclosed which comprises a plurality of washing tanks for semiconductor wafers, air duct means defining blowing ports for discharging a flow of air over the washing tank, suction port means disposed opposite the blowing ports to remove the air after passing over the washing tank. And also the apparatus comprises ionizer means mounted on at least one side of the washing tank to ionize air flowing over the washing tank. Thus ionized air serves to neutralize electrostatic charge on surfaces of semiconductor wafers to thereby prevent dust or particles from sticking to the wafer surfaces.

5 Claims, 3 Drawing Sheets

APPARATUS FOR WASHING SEMICONDUCTOR MATERIALS

BACKGROUND OF THE INVENTION

1) Field of the invention

The present invention relates to apparatus for washing semiconductor wafers with liquid including cleaning chemicals and with pure water.

2) Description of the Prior Art

Washing apparatus for washing semiconductor wafers is known having a plurality of washing tanks positioned in a case, some of which contain therein liquid including cleaning chemicals and other tanks contain therein pure water. The so called chemical tanks and pure water tanks are mutually disposed. In the respective tanks, liquid or pure water is introduced thereinto from the bottom thereof and overflown from the tank, and is circulated by a pump through a filter.

The case in which the washing tanks are positioned have an air duct means defining blowing ports for discharging clean air flowing over the washing tanks and suction ports opposite the blowing ports. The respective washing tanks are disposed between the blowing port and the suction port. The suction port serves to remove the air after passing over the washing tank. Also, washing tanks are integrally formed with an overflow tank which receives pure water or liquid overflowing the washing tank.

These washing tanks within a case are set in a clean room and subjected to a downwardly directed discharge of clean air from the ceiling of the room. This arrangement acts to prevent vapour from cleaning chemical tanks from entering the pure water tanks.

In the respective washing tanks, semiconductor wafers housed in a carrier are dipped in pure water or liquid. Pure water overflows the periphery of the pure water tank after the tank is full of pure water, and then the water within the tank is quickly discharged through a port formed at the bottom of the tank by opening a valve thereof. After that, closing the port with the valve, pure water is again introduced into the tank to overflow and then quickly discharged similarly. After such process is repeated several times, semiconductor wafers within a carrier are transferred into the next cleaning chemical tank to be washed therein, and after that, transferred into the next other pure water tank to be washed in the manner described, and finally into the final washing tank to be washed with pure or super-pure water.

Clean air is apt to receive static electricity because it is of a low degree of humidity, and electrostatic charge will occur on surfaces of semiconductor wafers in accordance with frictions of the wafer surfaces with clean air and pure water. Therefore, the wafer surfaces are apt to be sticked with particles and dust. This results in a lowering of productivity, because the surfaces of semiconductor wafers are sticked with foreign matters or particles contained slightly in clean air and dust generated in the operation of transfer robot or operator.

Otherwise, there has been seen Japanese Patent Laid-open Gazette No.42134/1989 which discloses means for introducing ionized air or gas into washing tanks through pipes and nozzles to thereby neutralize electrostatic charge on the wafer surfaces. However, in the known apparatus, since ionized air is transferred into washing tanks through pipes, the ionization in the air will reduce.

SUMMARY OF THE INVENTION

Therefore, an object of the present invention is to solve the above described problems in the prior art, and thus to provide an improved apparatus for washing semiconductor wafers which prevents suitably dust and foreign matters in air from sticking to surfaces of semiconductor wafers.

An apparatus for washing semiconductor materials according to the present invention comprises a plurality of washing tanks for semiconductor materials, air duct means defining blowing ports for discharging a flow of air over the washing tank, suction port means disposed opposite the blowing ports to remove the air after passing over washing tank, and ionizer means mounted on at least one side of the washing tank to thereby ionize air flowing the washing tank.

Accordingly, since the ionizer means ionizes clean air flowing over the washing tank, possible electrostatic charge will be neutralized with the ionized air, which prevents dust and foreign particles from sticking to the wafer surfaces.

DETAILED DESCRIPTION OF THE INVENTION AND THE PREFERRED EMBODIMENTS

Figure 1:
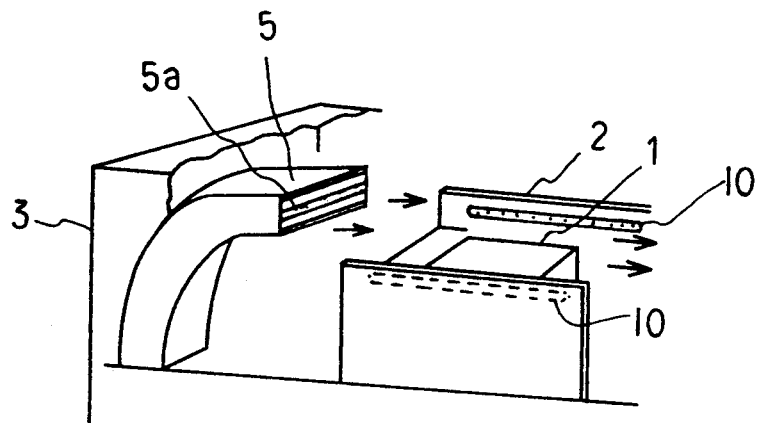
FIG. 1 is a perspective view of a main portion of an apparatus for washing semiconductor materials embodied by the invention.
Figure 2:
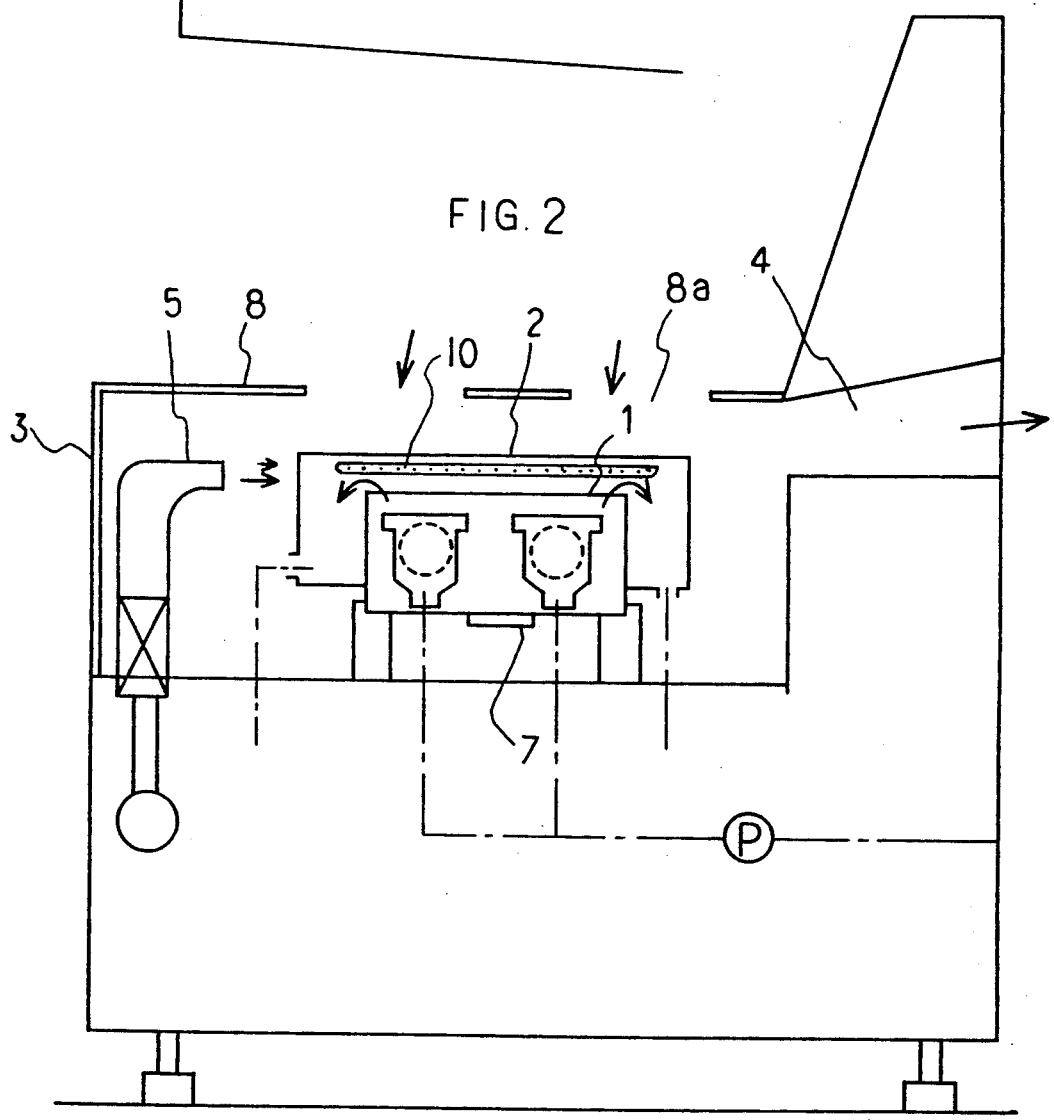
FIG. 2 is a vertical sectional view of the apparatus.
Figure 3:
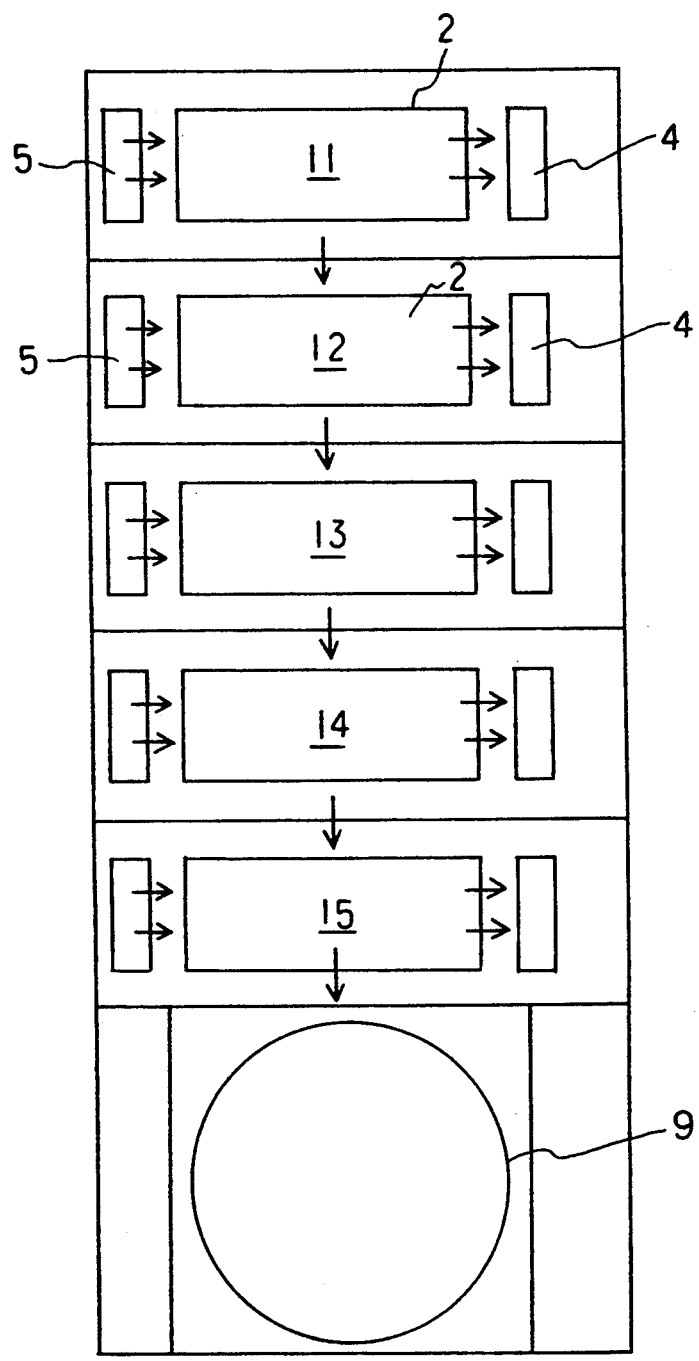
FIG. 3 is a plan view showing the entirety of the washing apparatus.

The invention will now be described with reference to the preferred embodiments. As seen in FIGS. 1 and 2 which show a preferred embodiment of the invention, the washing apparatus includes a plurality of washing tanks 1, each washing tank being surrounded with an overflow tank 2 formed integrally therewith. The overflow tanks 2 are disposed in a case 3 in several rows as shown in FIG. 3, and positioned in a clean room.

The washing tank 1 provided with the overflow tank 2 is made of fluororesin or quartz. The case 3 has an air duct defining blowing ports 5 for directing clean air therethrough and suction ports 4 which are opposite the blowing ports. The respective washing tanks 1 containing pure water have a valve 7 at the bottom thereof for discharging water.

As shown in the Figures, the blowing port 5 is preferably formed as transversely elongated openings, for example as divided into upper and lower transverse openings with an intermediate partition plate 5a. The washing tanks 1 are subjected to a downwardly directed discharge of clean air from the ceiling 6 through openings 8a in a cover 8.

The washing apparatus of the invention includes an ionizer or ionizers 10 mounted at least on one side of the washing tank 1 in order to ionize the air flowing over the washing tank 1, which characterizes the invention.

Where the washing tank 1 is formed with the overflow tank 2 as shown in the Figures, the ionizer means 10 will be mounted on one side wall or on a pair of opposed side walls of the overflow tank 2, said one or a pair of side walls being parallel to the direction of clean air flowing from the blowing port 5 to the suction port 4. For the purpose, said side wall or walls are protruded upwardly, and the ionizer or ionizers are mounted on inner surface of the protrudent portion of the side wall.

The ionizer per se is known which generates corona discharge by application of high voltage as a hundred thousand volt on electrodes so as to ionize surrounding air to positive or negative charge which serve to neutralize charges on a charged body with anti-polarity ion.

FIG. 3 shows an example of the entirety of washing apparatus, in which the overflow tanks 2 are disposed in a plurality of rows, for example as shown, in five rows, and after the final washing, semiconductor wafers are dried by a spin dryer 9. This apparatus shown in FIG. 3 includes cleaning chemical tank 11 for the first washing, pure water tank 12, cleaning chemical tank 13, pure water tank 14 and the final washing tank 15 containing super-pure water therein, these tanks being disposed in an order. The respective rows in the case have the blowing port 5 and the suction port 4 opposite thereto. Semiconductor wafers housed in a carrier are transferred successively by means of a transfer machine (robot).

In the described embodiment the washing tanks are provided with the overflow tank 2, whereas the washing tanks will not have the overflow tank 2, in which the ionizer 10 will be supported by any support rod or any plate secured therearound.

Figure 4:
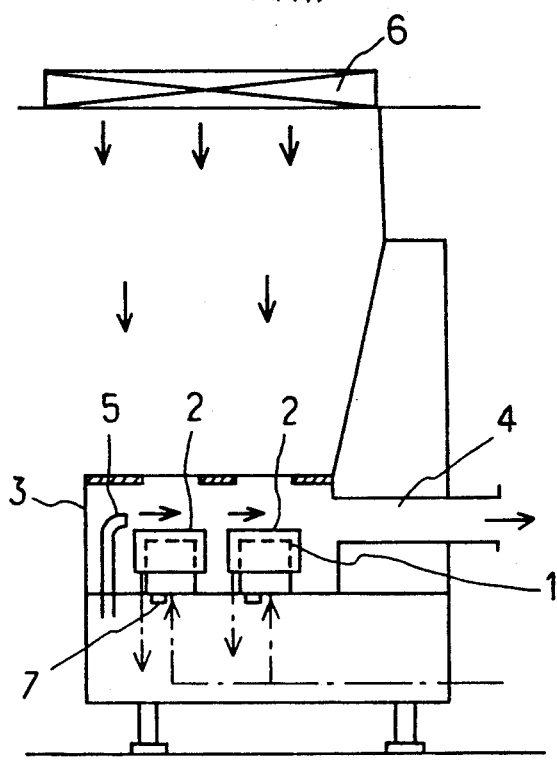
FIG. 4 is a vertical sectional view of a prior art washing apparatus.
Figure 5:
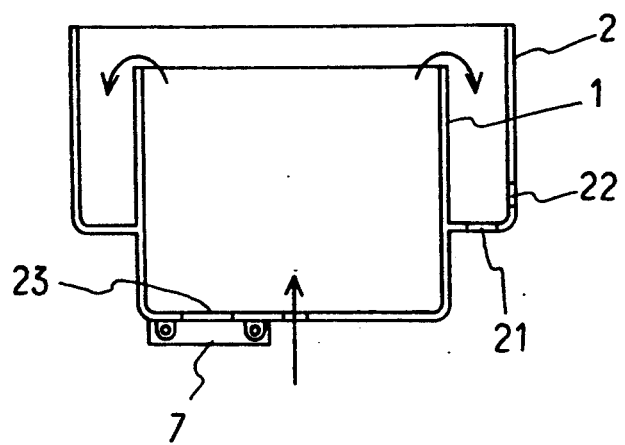
FIG. 5 is a vertical sectional view of a washing tank used in prior art.

In operation, semiconductor wafers in a carrier are washed in the washing tanks 1, over which clean air flows directed from the respective blowing ports 5 and the ceiling 6 of the room to the respective suction ports 4. Therefore, upper portion and periphery of the washing tanks 1 are surrounded with clean air. The formation of the clean air atmosphere is similar to the prior art apparatus shown in FIGS. 4 and 5 in which clean air flows over the overflow tanks 2 from the blowing ports 5 and from the ceiling 6 to the suction ports 4. When the pure water tank 1 in such an apparatus is in the overflown condition, water discharges through holes 21 and 22 formed in the overflow tank and after that, water in the washing tank 1 is discharged quickly through a port at the bottom thereof by opening the valve 7. This quick discharge of water and air flow will generate electrostatic charge on surfaces of semiconductor wafers according to friction of the wafer surfaces with water and air, which leads to the previously described drawbacks in the prior art apparatus.

In the washing apparatus of our invention, the ionizer 10 mounted on a side or both sides of the washing tank ionizes clean air, and ionized air serves to neutralize electrostatic charge on the wafer surfaces to avoid such static electricity.

The polarity of the voltage applied on the electrodes of the ionizer 10 will be desirably changed in a suitable cycle to thereby change polarity of ion in the ionized air.

As mentioned above, according to the washing apparatus of the invention, because ionizer means are mounted on one or both sides of the tank, ionization of the ionized air in the washing tank keeps effective. Therefore, because the ionized air generated in the ionizer means serves effectively to neutralize possible electrostatic charge on the wafer surfaces to avoid the charge, the wafer surfaces prevent dust and particles from sticking thereto. This leads to an excellent washing of semiconductor wafers and therefore to higher productivity.

What is claimed is:

1. Apparatus for washing semiconductor materials comprising:
    a plurality of washing tanks for semiconductor materials,
    air duct means defining blowing ports for discharging a flow of air over the plurality of washing tanks,
    suction port means disposed opposite the blowing ports to remove the air after passing over the plurality of washing tanks, and
    ionizer means mounted on at least one side of an overflow tank formed integrally with and surrounding the plurality of washing tanks to ionize air flowing over the plurality of washing tanks, wherein build-up of static charge and resultant staining of the semiconductor materials in inhibited.

2. Apparatus as claimed in claim 1, wherein said ionizer means are mounted on both side of the overflow tank.

3. Apparatus as claimed in claim 1, wherein said ionizer means is mounted on one side of the overflow tank.

4. Apparatus as claimed in claim 1, wherein said ionizer means are mounted on at least one side of the overflow tank in which the washing tank contains pure water.

5. Apparatus for washing semiconductor materials comprising:
    a plurality of washing tanks for semiconductor materials,
    air duct means defining blowing ports for discharging a flow of air over the plurality of washing tanks,
    suction port means disposed opposite the blowing ports to remove the air after passing over the plurality of washing tanks, and,
    ionizer means mounted on at least one side are of the washing tanks by means of support means, wherein build-up of static charge and resultant staining of the semi-conductor materials is inhibited.

* * * * *

UNITED STATES PATENT AND TRADEMARK OFFICE
CERTIFICATE OF CORRECTION

PATENT NO. : 5,190,064

DATED : March 2, 1993

INVENTOR(S) : Seiichiro AIGO

It is certified that error appears in the above-identified patent and that said Letters Patent is hereby corrected as shown below:

Column 4,

Claim 1, line 15, change "in" to --is--.

Claim 5, line 10, change "are" to --area--.

Signed and Sealed this

Seventh Day of December, 1993

Attest:

BRUCE LEHMAN

*Attesting Officer*    *Commissioner of Patents and Trademarks*